United States Patent
Inoue et al.

(10) Patent No.: US 7,213,332 B2
(45) Date of Patent: May 8, 2007

(54) METHOD COMPONENT ON A CIRCUIT BOARD

(75) Inventors: Masafumi Inoue, Saga (JP); Yusuke Yamamoto, Fukuoka (JP); Hikaru Onizaki, Fukuoka (JP); Youichi Yanai, Saga (JP); Yasuhiro Morimitsu, Saga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 27 days.

(21) Appl. No.: 10/922,731

(22) Filed: Aug. 20, 2004

(65) Prior Publication Data

US 2005/0015975 A1  Jan. 27, 2005

Related U.S. Application Data

(63) Continuation of application No. 09/947,323, filed on Sep. 5, 2001, now abandoned.

(30) Foreign Application Priority Data

Sep. 8, 2000  (JP) .............................. 2000-272823

(51) Int. Cl.
*H05K 3/34* (2006.01)
(52) U.S. Cl. ....................... 29/840; 29/739; 29/740; 29/832; 29/833; 29/720
(58) Field of Classification Search .................. 29/739, 29/740, 832, 833, 840, 843, 720
See application file for complete search history.

(56) References Cited

U.S. PATENT DOCUMENTS

| 4,733,462 A | 3/1988 | Kawatani |
|---|---|---|
| 4,812,666 A | 3/1989 | Wistrand |
| 4,951,240 A | 8/1990 | Fukino |
| 5,003,692 A | 4/1991 | Izumi et al. |
| 5,249,349 A * | 10/1993 | Kuinose et al. ................ 29/721 |
| 5,436,028 A | 7/1995 | Becher et al. |
| 5,555,316 A | 9/1996 | Tsujikawa et al. |
| 5,564,183 A | 10/1996 | Satou et al. |
| 5,607,097 A | 3/1997 | Sato et al. |
| 2002/0112348 A1 | 8/2002 | Inoue et al. |

FOREIGN PATENT DOCUMENTS

| JP | 4-2200 | 1/1992 |
|---|---|---|
| JP | 4-34990 | 2/1992 |
| JP | 4-48248 | 2/1992 |
| JP | 05-129800 | 5/1993 |
| JP | 05-251897 | 9/1993 |
| JP | 5-251897 | 9/1993 |
| JP | 7-22791 | 1/1995 |
| JP | 2002-118396 | 4/2002 |

* cited by examiner

*Primary Examiner*—Richard Chang
(74) *Attorney, Agent, or Firm*—RatnerPrestia

(57) ABSTRACT

A method of mounting a component on electrodes on a board. Mounting coordinates for mounting the component are calculated. A determination is made of printing positions where solders for the component is situated on the electrodes. The printing positions of the solders are stored. Mounting position data for where the component is to be mounted on the solders is prepared based on the previous steps. The component is mounted using the information gathered in the previous steps.

2 Claims, 5 Drawing Sheets

METHOD COMPONENT ON A CIRCUIT BOARD

This application is a continuation of U.S. patent application Ser. No. 09/947,323, filed Sep. 5, 2001 now abandoned.

FIELD OF THE INVENTION

The present invention relates to component mounters and mounting methods for mounting typically electronic components on a board, and more particularly to component mounters and mounting methods that prevent defective mounting caused by positional deviation of solder printing on the board.

BACKGROUND OF THE INVENTION

The need for positional accuracy when mounting components on electrodes formed on a board has been becoming ever more stringent as electronic components become smaller and mounting density becomes higher. For example, micro-components of only about 0.6 mm×0.3 mm in size are already commercialized. These small components require extremely accurate mounting positions. The electrode position has conventionally been confirmed by identifying a recognition mark provided on the board to ensure correct positioning of a component onto an electrode when the component is placed on the electrode on the board by means of a transfer head.

However, micro-components as described above may show defects after being mounted due to lack of mounting position accuracy for the reasons described below.

A conventional method for mounting micro-components is described next with reference to drawings.

FIGS. 5A to 5C are process charts of the conventional component mounting method.

In FIG. 5A, numerous electrodes 1a onto which electronic components are soldered are provided on board 1. Solder paste S is printed on electrodes 1a before the mounting process. In the mounting process, the position of each electrode 1a is identified based on mounting position data by detecting recognition mark 1b provided at the corner of board 1.

Component 2 is then mounted on identified electrode 1a.

However, the position of solder paste S printed on electrode 1a does not completely coincide with the position of electrode 1a due to changes of shape with time in board 1 or screen mask, and a slight positional deviation d may occur as shown in FIG. 5A. If component 2 is placed in relation to the position of electrode 1a in this state, as described above, the center line of a terminal of component 2 will deviate with respect to solder paste S as shown in FIG. 5B.

If board 1 is heated in a reflow process in this state, component 2 may rotate in the direction shown by an arrow in FIG. 5C as solder paste S melts. The rotation occurs due to non-uniform distribution of solder paste S contacting component 2 with respect to the center line of the terminal of component 2. In other words, component 2 rotates in the soldering process because the force of attraction generated by surface tension is applied to component 2 when melted solder wets and spreads on the terminal surface, and this force is applied asymmetrical with respect to the center line of component 2. Positional deviation in the direction of the arrow remains if solder paste S solidifies in this state, resulting in defective mounting. Accordingly, the conventional component mounting method may cause defective mounting due to positional deviation occurring at the time of solder printing.

SUMMARY OF THE INVENTION

The present invention solves the aforementioned disadvantage, and aims to offer a component mounter and mounting method that prevents defective mounting due to positional deviation of solder printing in component mounting.

A component mounter of the present invention picks up a component from a component feeder carriage using a transfer head, and mounts the component on a board. The component mounter of the present invention comprises:

(a) a positioner for positioning the board relative to the transfer head;

(b) a primary memory for storing position measurement results of solder printed on an electrode on the board;

(c) a calculator for calculating mounting coordinates for mounting the component using the transfer head based on the measurement results; and (d) a controller for driving the positioner based on the mounting coordinates.

A mounting method of the present invention is to pick up a component from a component feeder carriage using the transfer head, and mount it on the board. The mounting method of the present invention comprises the next steps:

(a) storing position measurement results of solder printed on an electrode on the board;

(b) calculating mounting coordinates based on the measurement results when mounting the component using the transfer head; and (c) controlling a positioner for positioning the board relative to the transfer head based on the mounting coordinates.

The mounting coordinates for mounting the component using the transfer head are calculated based on the solder printing position measurement results, and the board is relatively positioned with respect to the transfer head based on these mounting coordinates. No positional deviation between the component and printed solder thus occurs when the component is mounted. Accordingly, defective mounting, which may occur in a reflow process due to positional deviation, is preventable.

DETAILED DESCRIPTION OF THE INVENTION

A preferred embodiment of the present invention is described below with reference to drawings.

Figure 1:
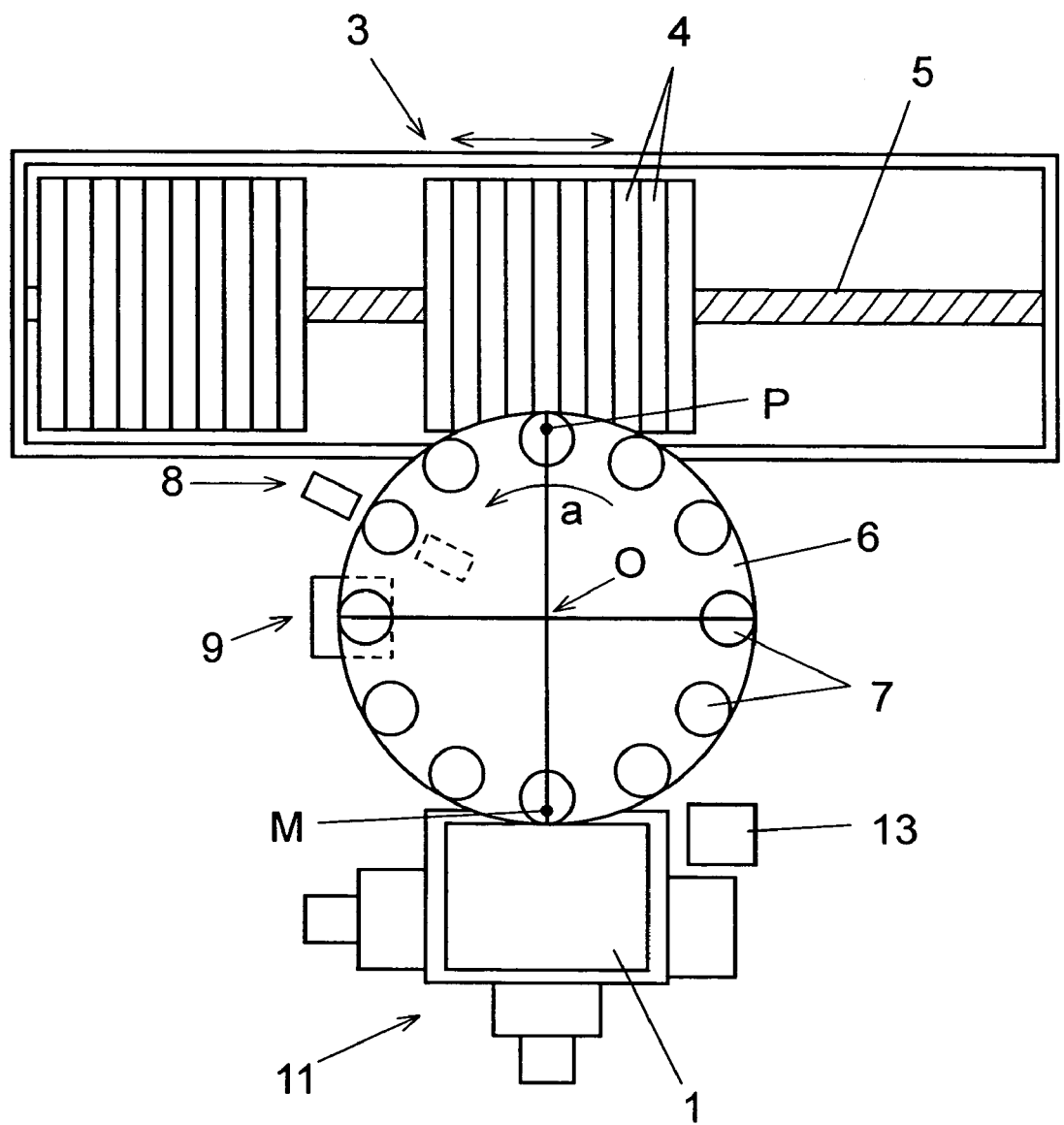
FIG. 1 is a plan view of a component mounter in accordance with a preferred embodiment of the present invention.
Figure 2:
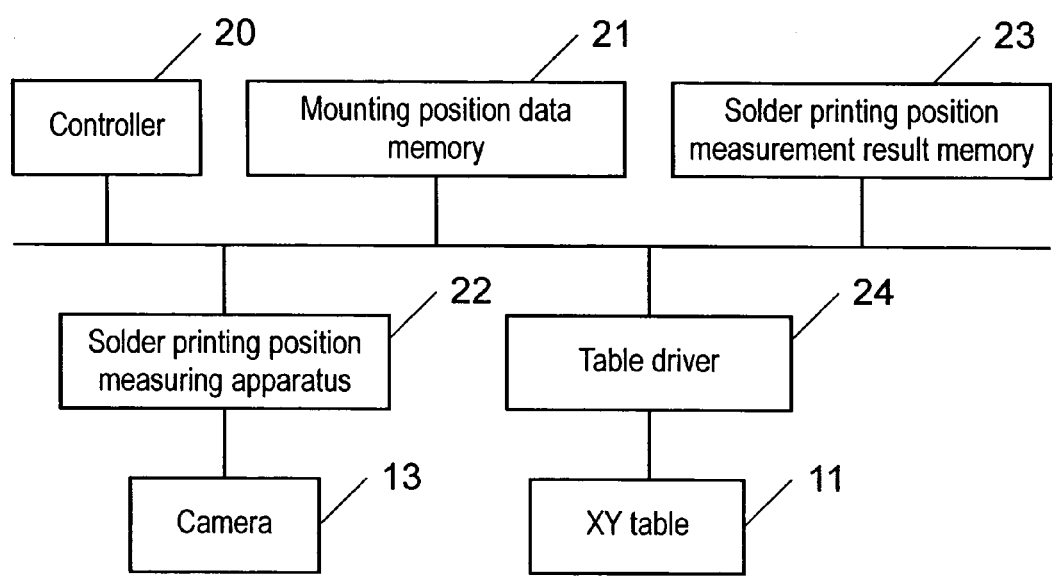
FIG. 2 is a block diagram illustrating the configuration of a control system of the component mounter in accordance with the preferred embodiment of the present invention.
Figure 3:
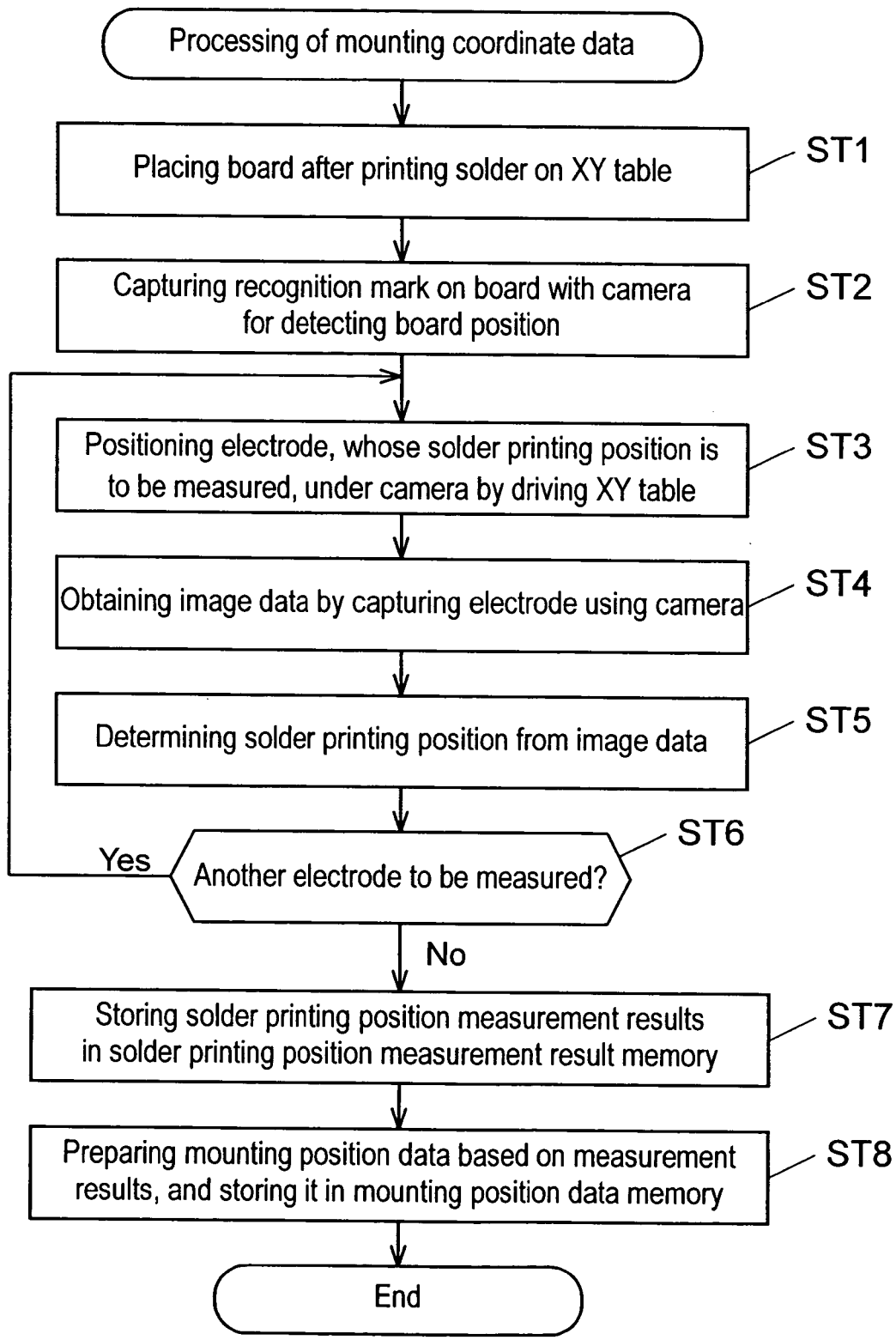
FIG. 3 is a flow chart illustrating how mounting coordinate data is processed in the component mounter in accordance with the preferred embodiment of the present invention.
Figure 4A:
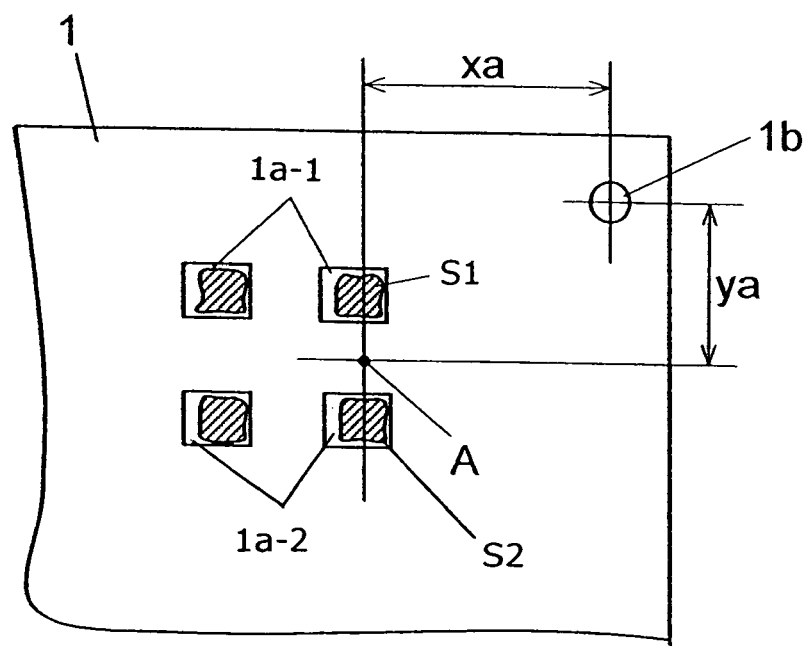
FIGS. 4A to 4C are process charts illustrating a component mounting method in accordance with the preferred embodiment of the present invention.
Figure 4B:
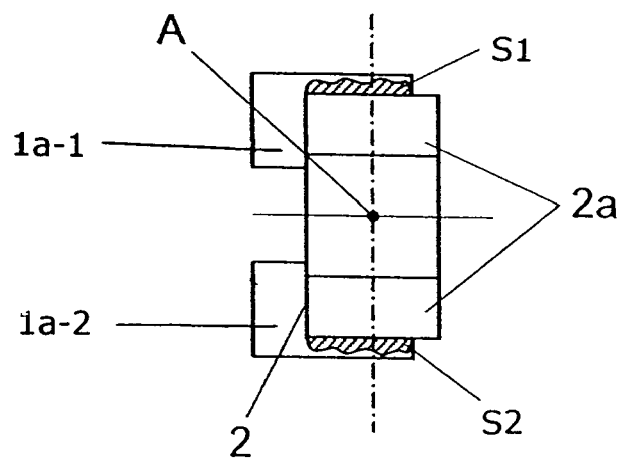
Figure 4C:
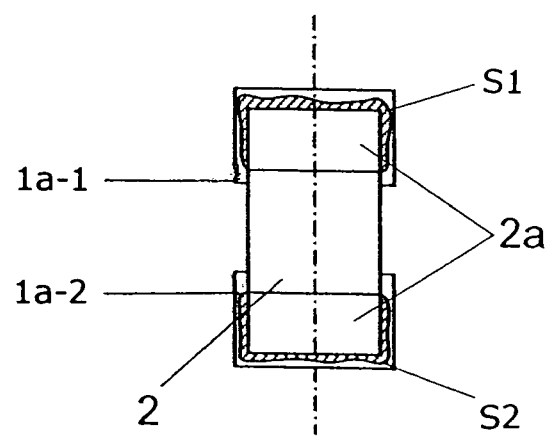
Figure 5A:
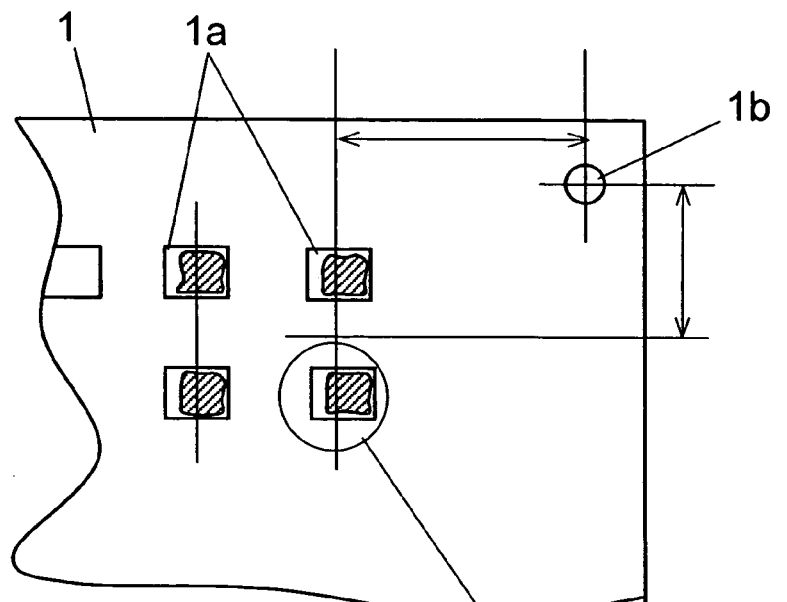
FIGS. 5A to 5C are process charts illustrating a conventional component mounting method.
Figure 5B:
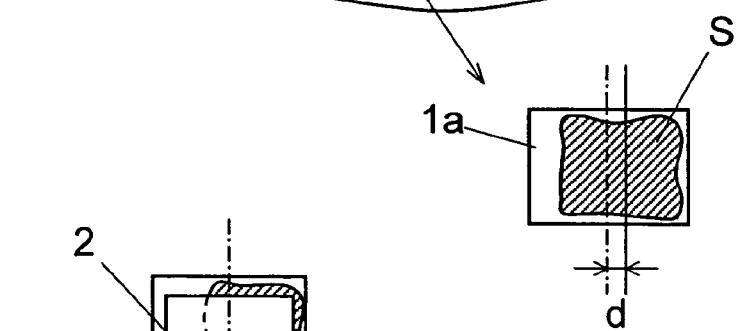
Figure 5C:
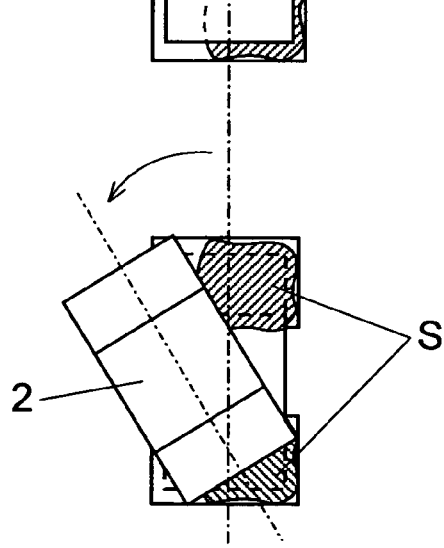

FIG. 1 is a plan view of a component mounter, FIG. 2 is a block diagram of a control system for the component mounter, and FIG. 3 is a flow chart illustrating how mounting coordinate data is processed in the component mounter in the preferred embodiment of the present invention. FIGS. 4A to 4C are process charts illustrating a component mounting method in the preferred embodiment of the present invention.

First, the configuration of the component mounter is described with reference to FIG. 1.

In FIG. 1, numerous parts feeders 4 are provided on component feeder carriage 3. Parts feeders 4 are attached to a feeder base (not illustrated), and move horizontally by rotating feed screw 5.

Rotary head 6 is disposed at the front of feeder carriage 3. This rotary head 6 rotates in the direction of arrow 'a' centering on main shaft O. Several transfer heads 7 are disposed on the periphery of rotary head 6. Each head 7 has several suction nozzles (not illustrated). Head 7 moves vertically at pickup position P on a vacuum-suction station, and picks up components from parts feeders 4. Here, parts feeders 4 move horizontally by screw 5 so that head 7 can pick up a required component.

Each head 7 is disposed on the periphery of rotary head 6, centering on main shaft O, and rotates on the shaft of head 7 (centering on head rotation) by means of a driving mechanism (not illustrated). This rotation determines selection of multiple suction nozzles provided on head 7 and setting of horizontal rotation angle of the component held by the suction nozzle.

The component picked up at position P sequentially moves in the direction of arrow 'a' as a result of the rotation of rotary head 6. Height measurement station 8 is disposed on the moving path, and station 8 measures the height of the component held by head 7.

Component recognition station 9 is provided next to station 8. An image of the component held by the suction nozzle of head 7 is captured from the bottom by a camera (not illustrated) at station 9. The image captured is then processed to detect the dimensions of a plan image of the component, i.e., length and width.

XY table 11 is disposed at the front of rotary head 6. This table 11 horizontally positions board 1. Table 11 thus acts as a positioner for horizontally positioning board 1 relative to transfer head 7. Transfer head 7 moving from station 9 reaches mounting position M on a mounting station over board 1, and mounts the component on board 1 by vertical movement.

Camera 13 is disposed next to table 11. Table 11 is driven to move board 1 to under camera 13. Camera 13 then captures a predetermined recognition point on board 1 to detect the position and shape of a recognition target. For example, as shown in FIG. 4A, the position of recognition mark 1b formed on board 1 and the positions of electrodes 1a-1 and 1a-2 are detected; also, positional deviation of solders S1 and S2 with respect to electrodes 1a-1 and 1a-2 are detected by capturing an image of solder pastes S1 and S2 printed on electrodes 1a-1 and 1a-2.

Next, the configuration of a control system of the component mounter in the preferred embodiment of the present invention is described with reference to FIG. 2.

In FIG. 2, controller 20, such as a CPU, controls the movement and calculations carried out in the entire component mounter. Solder printing position measurement result memory 23, which is the primary memory, stores measurement results of solder printing positions. Mounting position data memory 21, the secondary memory, stores mounting coordinates indicating each position of a mounting point on which the component will be mounted. Solder printing position measuring apparatus 22 measures the position of solder pastes S1 and S2 printed on each electrode, as shown in FIG. 4A, based on image data obtained through capturing an image of each electrode position by camera 13 for board recognition, and outputs relative position coordinates data with respect to recognition mark 1b on board 1.

Controller 20 reads out solder printing position measurement results stored in memory 23, and calculates component mounting coordinates based on solder printing position. In other words, controller 20 is a mounting coordinates calculator. Calculated mounting coordinates are fed to memory 21 to revise data on mounting coordinates. More specifically, mounting coordinates determined based on electrode position coordinates in accordance with design data are initially stored in memory 21, but this data is updated by rewriting mounting coordinates in the data based on actual measurement results after measuring the solder printing position. Table driver 24 drives XY table 11 which holds and moves the board. This table 11 is moved based on the aforementioned mounting coordinates by controlling driver 24 with controller 20.

The component mounter in the preferred embodiment is configured as described above.

Next, a mounting method using the above component mounter is described with reference to FIG. 3 and FIGS. 4A to 4C. The postion of solder paste printed on each electrode on the board in a previous process is measured before mounting the component. The mounting postion is determined based on the printing position measurement result.

In FIG. 3, board 1 after printing solder is (placed on XY table 11 (ST1). Recognition mark 1b on board 1 (FIG. 4A) is captured by camera 13, thus detecting the position of board 1 (ST2). Next, XY table 11 is driven to position electrodes 1a-1 and 1a-2, whose printing positions are to be measured, under camera 13 (ST3). Image data is then obtained by capturing the image of electrodes 1a-1 and 1a-2 by camera 13 (ST4). For moving XY table 11 when capturing the image of electrodes 1a-1 and 1a-2, mounting positions stored in mounting position data memory 21 prepared in advance based on design data are used.

Next, the printing positions of solder pastes S1 and S2 printed on electrodes 1a-1 and 1a-2, as shown in FIG. 4A, is measured based on the image data obtained as relative coordinates xa, ya of printing point A (a barycentric position of solder pastes printed on a pair of electrodes 1a-1 and 1a-2) with respect to recognition mark 1b (ST5). The position is recognized by solder printing position measuring apparatus 22.

Next, the presence of electrode 1a-1 to be measured next is determined (ST6). If there is a next electrode 1a-1 to be measured, the operation returns to ST3 to repeat the measurement of the solder printing position. If all electrodes to be measured are completed at ST6, measurement results of solder printing positions are stored in solder printing position measurement result memory 23 (ST7). Mounting position data to be used for actual mounting is then prepared based on the obtained solder printing position measurement results, and stored in mounting position data memory 21 (ST8). This completes the preparation and processing of the mounting position data that compensates for the positional deviation of solder printing.

Next, mounting starts for board 1 whose measurements of solder printing positions are completed. Here, component 2 is placed in accordance with mounting coordinates prepared based on the aforementioned solder printing position measurement results when placing component 2 on each electrode 1a-1 and 1a-2. In other words, component 2 is placed on printing point A of solder pastes S1 and S2 as a target position instead of electrodes 1a-1 and 1a-2 when printed solder pastes S1 and S2 deviate from electrodes 1a-1 and 1a-2, as shown in FIG. 4B. Accordingly, the positions of terminals 2a of component 2 mounted on the board deviates from electrodes 1a-1 and 1a-2 but is mounted without positional deviation with respect to solder pastes S1 and S2.

After components are placed on each electrode position, board 1 is sent to the reflow process to heat and melt solder pastes S1 and S2 so as to solder terminals 2a onto electrodes 1a-1 and 1a-2. Terminals 2a whose position has deviated from electrodes 1a-1 and 1a-2 before heating is attracted by electrodes 1a-1 and 1a-2 by the self-alignment effect when solder pastes S1 and S2 melts. The self-alignment effect is a phenomenon by which terminals 2a are attracted to electrodes 1a-1 and 1a-2 when melted solder wets and spreads over the surface of electrodes 1a-1 and 1a-2. Accordingly, as shown in FIG. 4C, terminals 2a are soldered onto electrodes 1a-1 and 1a-2 in the right position and right direction without experiencing any positional deviation.

Since mounting coordinates are set so as not to cause positional deviation between terminals 2a and solder pastes S1 and S2, as mentioned above, in the reflow process, no external force for moving component 2 in the rotating direction is applied, ensuring the self-alignment effect.

As described above, the preferred embodiment prepares mounting position data based on measurement results for solder printing positions on the actual board. This enables the prevention of deviated component mounting positions caused by variations in solder printing positions on each board. Accordingly, defective mounting may be reduced, even for micro-components which require high mounting accuracy, by preventing positional deviation of components after soldering.

The preferred embodiment shows an example of measuring solder printing positions by means of a camera installed in the component mounter. However, testing function installed in a screen-printing device may also be used. Alternatively, a separate exclusive appearance-testing device, other than the component mounter, may be used for measuring solder printing positions.

In the present invention, mounting coordinates for mounting components using the transfer head are calculated based on solder printing position measurement results in order to relatively position the board to the transfer head based on the mounting coordinates. This avoids the occurrence of positional deviations between the mounted components and printed solder, thus preventing defective mounting which may occur during the reflow process due to these positional deviations.

What is claimed is:

1. A method of mounting a component on a board, said method comprising the steps of:
   a) moving a board with a first electrode and a second electrode positioned on the board to a location based on intended mounting positions of the component,
   b) locating a first printing position where a first solder for said component is situated on the first electrode,
   c) locating a second printing position where a second solder for said component is situated on the second electrode
   d) storing the printing positions of said first solder and said second solder in a memory;
   e) locating where said component is to be mounted on said first and second electrodes based at least on said stored first and second printing positions of said first solder and said second solder; and
   f) mounting said component under control of a CPU on said first and second electrodes at said first and second printing positions.

2. The method of mounting components according to claim 1, wherein step e) includes the step of identifying a printing point based on a barycentric position of the first solder and the second solder situated on the first and second electrodes.

* * * * *

UNITED STATES PATENT AND TRADEMARK OFFICE
CERTIFICATE OF CORRECTION

PATENT NO. : 7,213,332 B2  
APPLICATION NO. : 10/922731  
DATED : May 8, 2007  
INVENTOR(S) : Masafumi Inoue et al.

Page 1 of 1

It is certified that error appears in the above-identified patent and that said Letters Patent is hereby corrected as shown below:

Title Page, Item (56) References Cited, FOREIGN PATENT DOCUMENTS
Delete duplicate "JP    5-251897    9/1993"

Signed and Sealed this

Twenty-eighth Day of August, 2007

JON W. DUDAS
*Director of the United States Patent and Trademark Office*